(12) United States Patent
Meng et al.

(10) Patent No.: US 8,829,327 B2
(45) Date of Patent: *Sep. 9, 2014

(54) THERMOELECTRIC MATERIAL AND THERMOELECTRIC DEVICE

(75) Inventors: Chui-Zhou Meng, Beijing (CN); Chang-Hong Liu, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 175 days.

This patent is subject to a terminal disclaimer.

(21) Appl. No.: 12/592,903

(22) Filed: Dec. 3, 2009

(65) Prior Publication Data

US 2010/0319750 A1 Dec. 23, 2010

(30) Foreign Application Priority Data

Jun. 19, 2009 (CN) .......................... 2009 1 0108234

(51) Int. Cl.
*H01L 35/30* (2006.01)
*H01L 35/12* (2006.01)

(52) U.S. Cl.
USPC ....................................... 136/236.1; 136/205

(58) Field of Classification Search
USPC ....................... 136/200, 205, 223, 228, 236.1
See application file for complete search history.

(56) References Cited

U.S. PATENT DOCUMENTS

| | | | |
|---|---|---|---|
| 2004/0167009 A1* | 8/2004 | Kuntz et al. ................. | 501/95.2 |
| 2005/0042450 A1 | 2/2005 | Sano et al. | |
| 2006/0118158 A1* | 6/2006 | Zhang et al. ................. | 136/205 |
| 2007/0205792 A1 | 9/2007 | Mouli et al. | |
| 2009/0013373 A1 | 1/2009 | Iizuka | |
| 2009/0133731 A1 | 5/2009 | Grebel et al. | |
| 2009/0134772 A1 | 5/2009 | Wei et al. | |
| 2009/0153510 A1 | 6/2009 | Jiang et al. | |

FOREIGN PATENT DOCUMENTS

| | | |
|---|---|---|
| CN | 1388540 | 1/2003 |
| CN | 101458609 | 6/2009 |
| TW | 200511632 | 3/2005 |
| TW | 200511632 | 6/2005 |
| TW | 200926242 | 3/2009 |
| TW | 200926242 | 6/2009 |

OTHER PUBLICATIONS

Philip et al "A New Synthetic Route to Enhance Polyaniline Assembly on Carbon Nanotubes in Tubular Composites", Smart Materials and Structures, vol. 13, No. 6, Nov. 9, 2004, pp. N105-N108.*
Hone et al "Thermolectric Power of Single-Walled Carbon Nanotubes", Physcial Review Letters, vol. 80, Issue 5, pp. 1042-1045 (1998).*
Mirza et al "Thermoelectric Properties of Aligned Carbon Nanotubes", Applied Physcis Letters, vol. 92, pp. 203116-1-203116-3, May 23, 2008.*
Thermoelectric power in inhomogeneous materials,Itzhak Webman,Joshua Jortner,Morrel H. Cohen,Physical Review B vol. 16, No. 6 Sep. 15, 1977.
Guo et al. Synthesis and Characterization of Multi-Walled Carbon Nanotube/Polythiophene Composites. Journal of Dispersion Science and Technology, 2008, V29: P706-P710.
Junhao Zeng et al, Multiwall Carbon Nanotubes Modified by Plasma and its Use as the Template to Grow up CdS Nanocrystalline, Research Express@NCKU, National Cheng Kung University, vol. 3(7), pp. 1-4, Mar. 14, 2008.
Xianglin Liu, You Can also Produce the Carbon Nanotube Sheet, Physics Bimonthly, The Physical Society of Republic of China, vol. 27(5), pp. 720-721, Oct. 2005.
Mengzhang Zhong , Observation and Control of Carbon Nanotubes in the Atmosphere by Optical Microscope and Atomic Force Microscope, Master's Thesis, Jul. 17, 2006.
Shamim M.Mirza, H.Grebel. Thermoelectric properties of aligned carbon nanotubes, applied physics letters 92, 203116 (2008).

* cited by examiner

*Primary Examiner* — Alexander Kollias
(74) *Attorney, Agent, or Firm* — Novak Druce Connolly Bove + Quigg LLP (57) ABSTRACT

A thermoelectric composite material includes a carbon nanotube structure and an electrically conductive polymer layer. The carbon nanotube structure includes a plurality of carbon nanotubes and spaces. The electrically conductive polymer layer is coated on surfaces of the carbon nanotubes.

9 Claims, 8 Drawing Sheets

THERMOELECTRIC MATERIAL AND THERMOELECTRIC DEVICE

RELATED APPLICATIONS

This application claims all benefits accruing under 35 U.S.C. §119 from China Patent Application No. 200910190569.8, filed on Sep. 30, 2009 in the China Intellectual Property Office.

BACKGROUND

1. Technical Field

This disclosure relates to a carbon nanotube (CNT) based thermoelectric material and a thermoelectric device using the same.

2. Description of Related Art

The thermoelectric effect is the direct conversion of temperature differences to electric voltage and vice versa. A thermoelectric material creates a voltage when there is a temperature gradient. Conversely when a voltage is applied to the thermoelectric material, it creates a temperature gradient (known as the Peltier effect). At atomic scale (specifically, charge carriers), an applied temperature gradient causes charged carriers in the material, whether they are electrons or electron holes, to diffuse from the hot side to the cold side, similar to a classical gas that expands when heated; hence, the thermally-induced current. Seebeck coefficient of a thermoelectric material measures the magnitude of an induced thermoelectric voltage in response to a temperature difference across that material.

The performance of thermoelectric devices is quantified by a figure of merit, given by $ZT=S^2\sigma T/\kappa$, where S, $\sigma$, T and $\kappa$ are, respectively, the Seebeck coefficient, electrical conductivity, absolute temperature and thermal conductivity. Since Seebeck coefficient S has the square relation to the ZT value, indicating the ability of conversion between heat and electrical power, increasing the value of Seebeck coefficient is an effective way to enlarging the figure of merit of thermoelectric materials.

During the past years, great efforts have been taken to increase the efficiency of heat-power conversion. Various promising approaches have been explored to improve the figure of merit value, involving quantum-well structures, crystals with complex electronic structures, thin and multi-layer films, the so-called phonon-glass/electron-crystal compound materials and so on. Among them, composites were considered not to provide any benefit because it was determined and reported that the figure merit of composites could not be any higher than the maximum one of its components through theoretical numerical simulation (I. Webman, J. Jortner, M. H. Cchen, *Phys. Rev. B* 1977, 16, 2959.).

What is needed, therefore, is to provide a thermoelectric composite material with a high efficiency of heat-power conversion and a device using the same.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
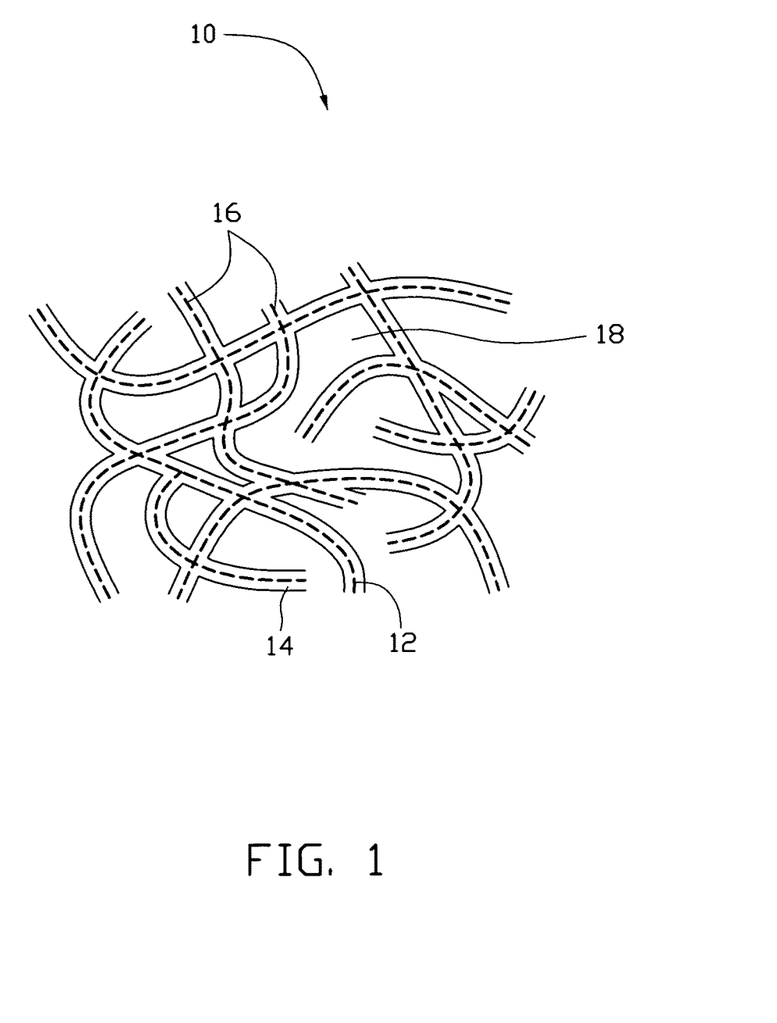
FIG. 1 is a schematic structural view of an embodiment of a thermoelectric composite material including disordered CNTs.
Figure 2:
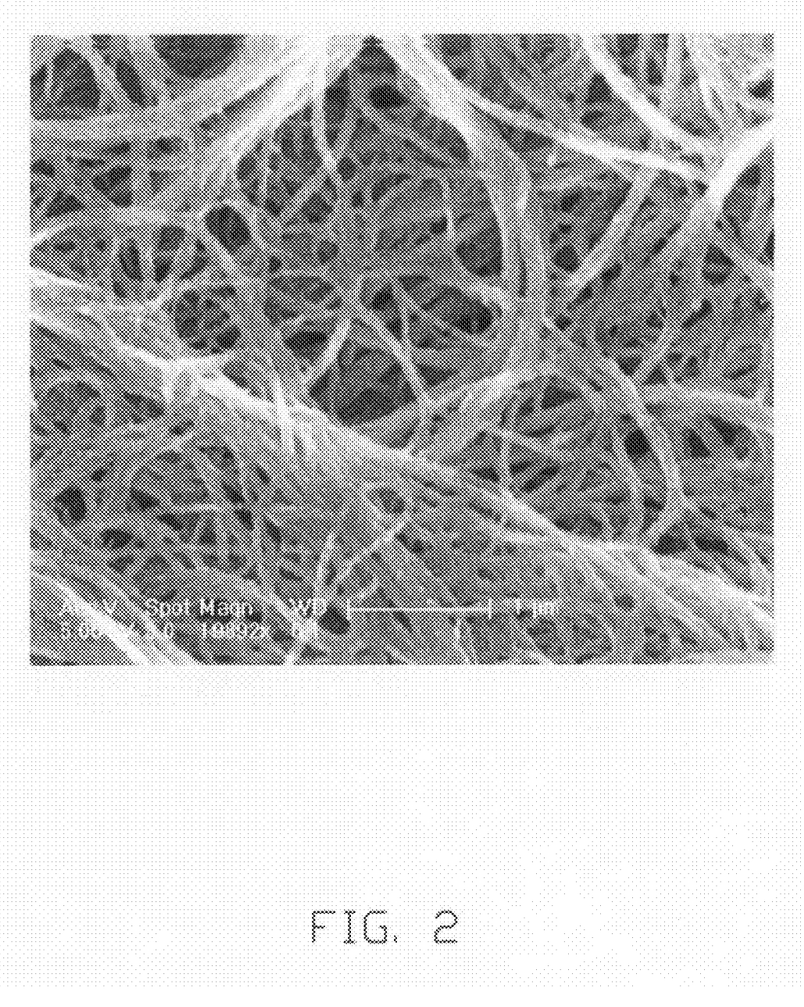
FIG. 2 is a scanning electron microscope (SEM) image of an embodiment of a thermoelectric composite material including disordered CNTs.

Referring to FIG. 1 and FIG. 2, an embodiment of a thermoelectric composite material 10 includes a CNT structure 16 and an electrically conductive polymer layer 14. The CNT structure 16 works as a framework. The electrically conductive polymer layer 14 is coated on the surfaces of the CNT structure 16. That is, the electrically conductive polymer layer 14 is supported by the CNT structure 16.

The CNT structure 16 includes a plurality of CNTs 12 and spaces 18. The plurality of CNTs 12 is assembled together by Van der Waals attractive forces. The spaces 18 are formed between the adjacent CNTs 12 of the CNT structure 16. A size of each space 18 can be in a range from about 50 nanometers to about 500 nanometers. The size of the space 18 represents the maximum distance between two points on the space 18. The thermoelectric composite material 10 includes a plurality of spaces 18, forming a plurality of micropores.

The electrically conductive polymer layer 14 is coated on the spaces 18 of the CNT structure 16. The electrically conductive polymer layer 14 wraps around the CNTs 12 to form a tubular coating layer structure. Here, the individual CNT 12 and the CNT structure 16 serve as the core and the template. In one embodiment, the electrically conductive polymer layer 14 is disposed on the whole surface of the CNT structure 16, which means that the surface of each CNT 12 is coated by the electrically conductive polymer layer 14.

Further, the CNTs 12 in the CNT structure 16 can be arranged orderly or disorderly. The term 'disordered CNT structure' includes, but is not limited to, a structure where the CNTs are arranged along many different directions so that the number of CNTs arranged along each different direction can be almost the same (e.g. uniformly disordered); and/or entangled with each other. 'Ordered CNT structure' includes, but is not limited to, a structure where the CNTs are arranged in a consistently systematic manner, e.g., the CNTs are arranged approximately along a same direction and or have two or more sections within each of which the CNTs are arranged approximately along a same direction (different sections can have different directions). In one embodiment, the CNT structure 16 includes a plurality of CNTs 12 arranged disorderly.

The CNTs 12 in the CNT structure 16 can be single-walled, double-walled, and/or multi-walled CNTs. It is also understood that the CNT structure 16 may comprise of many layers of ordered and/or disordered CNT films. Each layer of the ordered and/or disordered CNT films is coated with one electrically conductive polymer layer 14.

In one embodiment, the CNT structure 16 is a disordered CNT structure including a flocculated CNT film. The flocculated CNT film can include a plurality of long, curved, disordered CNTs entangled with each other. The length of the CNTs in the film can be greater than 10 centimeters. Furthermore, the flocculated CNT film can be isotropic. The CNTs can be substantially uniformly dispersed in the CNT film. The adjacent CNTs are acted upon by the van der Waals attractive force therebetween, thereby forming an entangled structure with spaces defined therein. If there is more than one flocculated CNT film, the electrically conductive polymer layer 14 is coated on each one of the flocculated CNT film.

The flocculated CNT film is very porous. Sizes of the spaces can be less than 10 micrometers. The porous nature of the flocculated CNT film will increase specific surface area of the CNT structure. Further, due to the CNTs in the CNT structure being entangled with each other, the CNT structure employing the flocculated CNT film has excellent durability, and can be fashioned into many desired shapes with a low risk to the integrity of CNT structure. Thus, the CNT structure may be formed into many shapes. The flocculated CNT film, in some embodiments, will not require the use of structural support due to the CNTs being entangled and adhered together by van der Waals attractive force therebetween. The thickness of the flocculated CNT film can range from about 0.5 nanometers to about 1 millimeter. It is also understood that many of the embodiments of the CNT structure are flexible and/or do not require the use of structural support to maintain their structural integrity.

A material of the electrically conductive polymer layer 14 can be polyaniline, polypyrrole, polythiophene, polyacetylene, polyparaphenylene, poly phenylene vinylene, or any combination thereof. A thickness of the electrically conductive polymer layer 14 is from about 30 nanometers to about 90 nanometers. A weight percentage of the electrically conductive polymer layer 14 in the thermoelectric composite material 10 is in a range from about 5% to about 80%. In one embodiment, the material of the electrically conductive polymer layer 14 is polyaniline, and the weight percentage of the electrically conductive polymer layer 14 in the thermoelectric composite material 10 is in a range from about 5% to about 20%.

Figure 3:
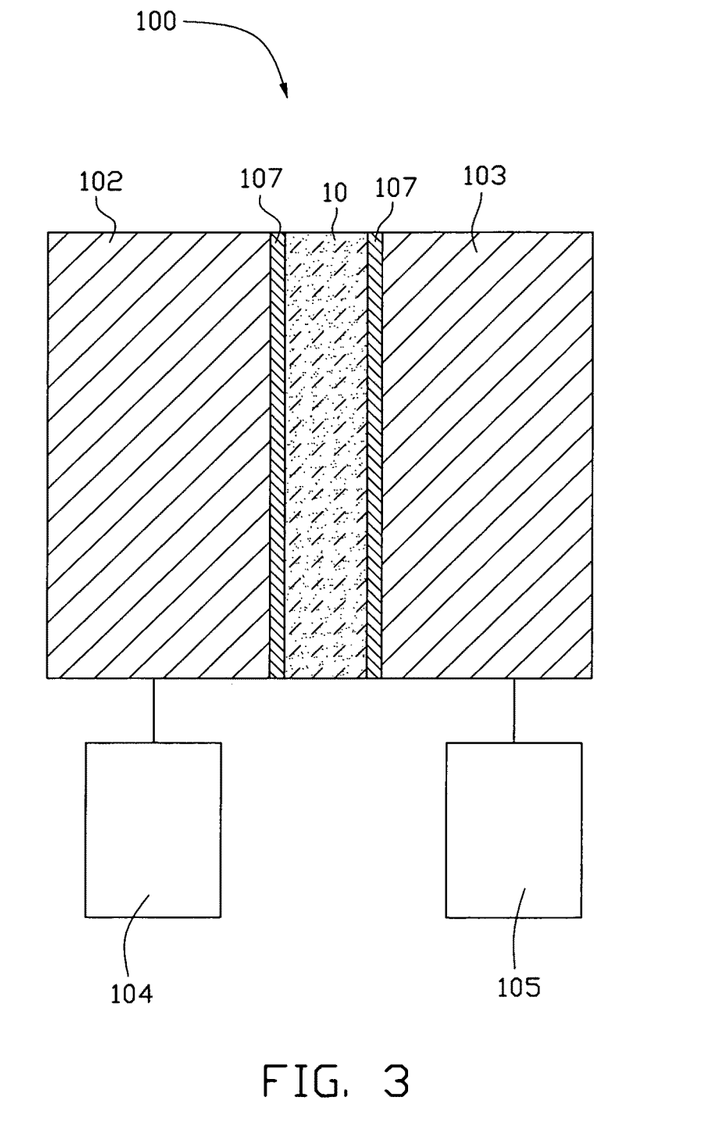
FIG. 3 is a cross-sectional view of a device used for measuring Seebeck coefficients of the thermoelectric composite material.

Referring to FIG. 3, a Seebeck coefficient measuring device 100 includes a first element 102 and a second element 103. Two thermocouples 107 are separately located on the two opposite surfaces of the first and second elements 102, 103. The first element 102 is cooled by a circulating liquid cooling device 104. The second element 103 is heated by a constant current constant voltage source 105. In one embodiment, the first element 102 and the second element are copper blocks, the thermoelectric composite material 10 is cut into round sheets. The round sheet has a diameter of 13 millimeters, a thickness of 55 microns and a weight of 3.95 milligrams.

The thermoelectric composite material 10 with a shape of round sheet can be located between the first and second elements 102, 103. A pressure is applied on the first and second elements 102, 103, which places the thermoelectric composite material 10 in substantially full contact with the first and second elements 102, 103. In one embodiment, the temperature of the first copper block 102 is maintained in a range from about 17° C. to about 19° C. via the circulating liquid cooling device 104. The temperature of the first copper block 103 is maintained in a range from about 47° C. to about 49° C. via the constant current constant voltage source 105.

The temperature difference ($\Delta T$) is measured via the two thermocouples 107 attached to the first and second elements 102, 103 on either side of the sheet of the thermoelectric composite material 10, respectively. The potential difference ($\Delta V$) is measured by a nanovoltmeter (not shown) with two copper branches welding the first and second elements 102, 103, respectively. The temperature and potential differences are simultaneously measured, so the Seebeck coefficient at temperature $T=(T_1+T_2)/2$ can be obtained by $S=\Delta V/\Delta T$. The Seebeck coefficient of a flocculated CNT film and a polyaniline sheet is measured via the same method as described above.

Figure 4:
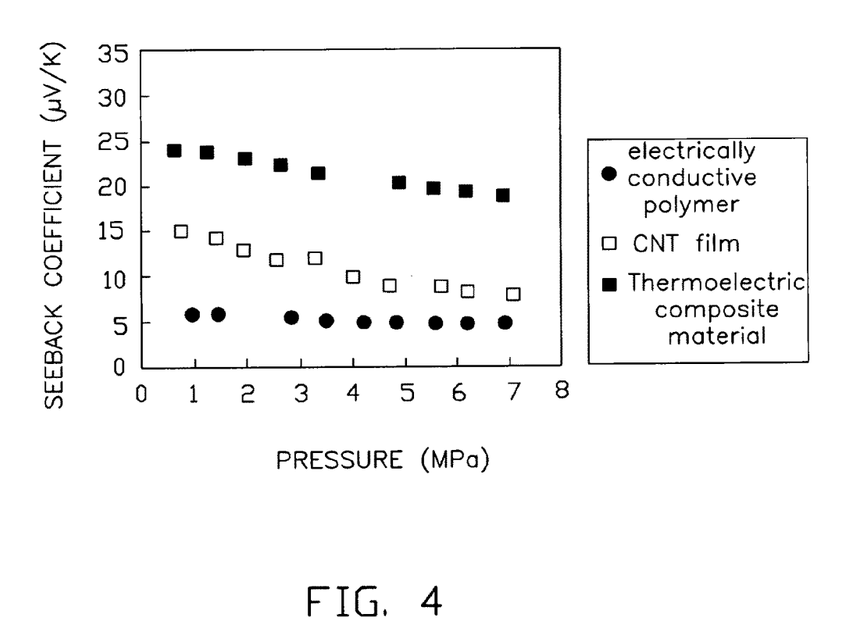
FIG. 4 displays distribution of Seebeck coefficients of the thermoelectric composite martial, a flocculated CNT film and a polyaniline sheet under different pressures.

Referring to FIG. 4, it is noted that the Seebeck coefficient of the thermoelectric composite material 10 is far greater than that of the flocculated CNT film and that of the polyaniline sheet. For the thermoelectric composite material 10 employing a flocculated CNT film and a polyaniline sheet as the conductive polymer, an enhancement of 20.4% were observed over any of the parts. Since Seebeck coefficient has the square relation to the Z value, indicating the ability of conversion between heat and electrical power, our approach would be a possible and effective way to enlarging the figure of merit of the thermoelectric materials 10. Thus the thermoelectric composite material 10 has a high efficiency of heat-power conversion.

While it is not totally clear why this composite has this effect, it is believed that the reason for the Seebeck coefficient enhancement is as follows. One-dimension nanoscale material was considered to have better thermoelectric properties than 2D or 3D ones. There is believed to be a much higher density of states at Fermi level in low-dimension structures. Conducting polymers are also usually referred to 1D material as CNTs. So the carriers are confined along the polymer chains and the tube axis, respectively. While in the pure PANI, polymer chains easily gathered in the form of short bars or clusters, so 1D character was unconspicuous. Using the novel method described here, polyaniline coatings can grow gradually around the CNT template. The thin polyaniline layer coating CNTs constitute a freestanding network and the nanowires preferably lie down in the plane perpendicular to thickness direction. When a carrier transported from a CNT coated polyaniline to another one, it would pass through a CNT/polyaniline interface and a thin polyaniline layer. So lots of barriers in the form of interfaces would exist through the transport along the thickness direction. Here a phenomena called energy-filtering effect (i.e., appropriate potential barriers at crystallite boundaries restrict the carriers with lower energy than the barrier height entering a material, while allowing the ones with a higher mean energy substantially passing through the interface preferentially) may arise, thereby increasing the mean carrier energy in the flow, hence, the Seebeck coefficient.

Figure 5:
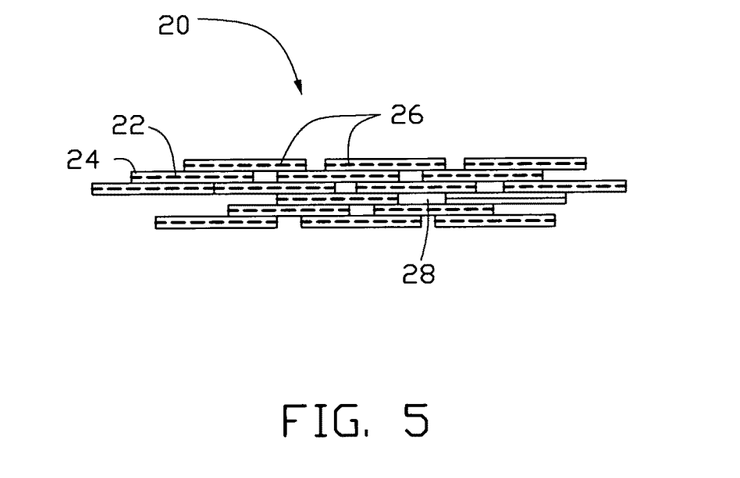
FIG. 5 is a schematic structural view of another embodiment of a thermoelectric composite material including ordered CNTs.

Referring to FIG. 5, one embodiment of a thermoelectric composite material 20 includes a CNT structure 26 and an electrically conductive polymer layer 24. The CNT structure 26 is a Ordered CNT structure including a plurality of spaces 28 and CNTs 22. The CNTs 22 are arranged orderly in the CNT structure 26. The plurality of spaces 28 is formed between the adjacent CNTs 22 in the CNT structure 26. A size of the spaces 28 is in a range from about 50 nanometers to about 500 nanometers. The electrically conductive polymer layer 24 is disposed on the whole surface of the CNT structure 26, which means that the surface of each CNTs 22 is coated by the electrically conductive polymer layer 24. The CNT structure 26 can include at least one drawn CNT film. The drawn CNT film includes a plurality of successive and oriented CNTs joined end-to-end by van der Waals attractive force therebetween. The drawn CNT film can be formed by drawing a film from a CNT array that is capable of having a film drawn therefrom. The drawn CNT film includes a plurality of spaces formed between the adjacent CNTs in the drawn CNT film. The CNT structure 16 can also include at least two stacked drawn CNT films. An angle α between the preferred orientation of the CNTs in the two adjacent CNT films is in a rang from about 0 degrees to about 90 degrees.

The CNT structure 26 can also include at least one pressed CNT film. The CNTs in the pressed CNT film are arranged along a same direction or arranged along different directions. The CNTs in the pressed CNT film can be overlapped with each other. The adjacent CNTs are combined and attracted by van der Waals attractive force. An angle between a primary alignment direction of the CNTs and a base of the pressed CNT film such that the angle is in a range from about 0 degrees to about 15 degrees. The pressed CNT film can be formed by pressing a CNT array. The angle is closely related to pressure applied to the CNT array. The greater the pressure is, the smaller the angle is. The CNTs in the pressed CNT film can parallel to the surface of the pressed CNT film when the angle is 0 degrees. A length and a width of a single pressed CNT film is determined by the size of the array.

Figure 6:
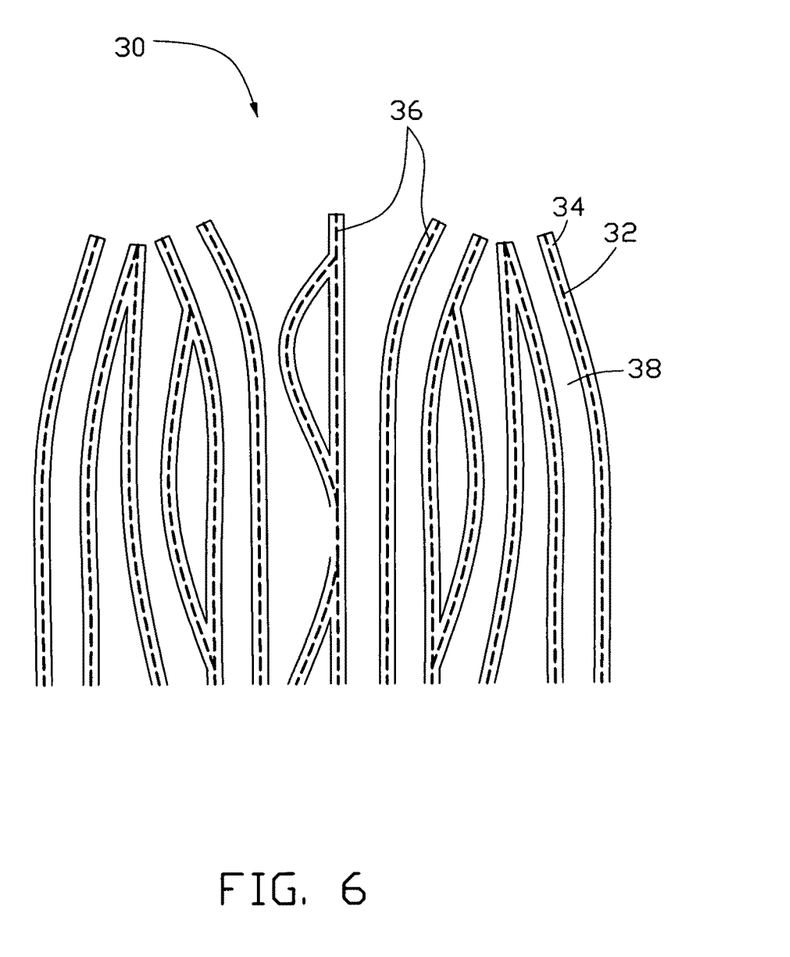
FIG. 6 is a schematic structural view of an embodiment of a thermoelectric composite material including a CNT array.

Referring to FIG. 6, another embodiment of a thermoelectric composite material 30 includes a CNT structure 36 and an electrically conductive polymer layer 34. The CNT structure 36 includes a plurality of CNTs 32 and a plurality of spaces 38 defined by and between the CNTs 32. The CNT structure 36 is an array. The electrically conductive polymer layer 34 is coated on the surface of the CNTs 32.

Figure 7:
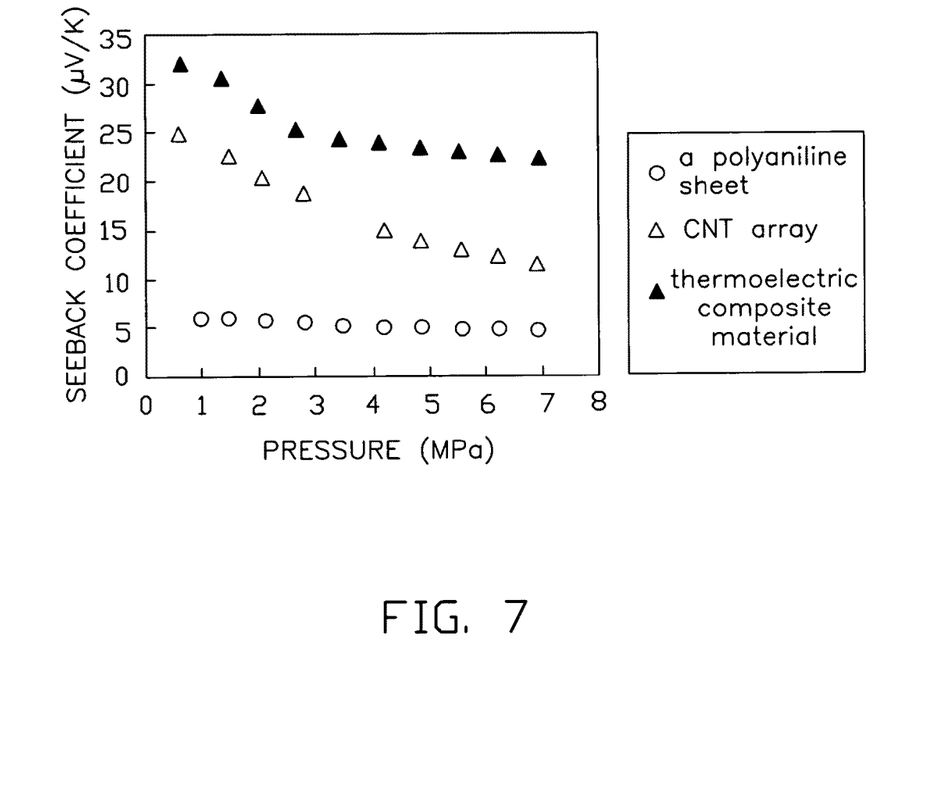
FIG. 7 displays distribution of Seebeck coefficients of the thermoelectric composite martial, a CNT array and a polyaniline sheet, under different pressures.

Referring to FIG. 7, it demonstrates that the Seebeck coefficient of the thermoelectric composite material 30 is far greater than the CNT array and the polyaniline sheet. Thus the thermoelectric composite material 30 has a high efficiency of heat-power conversion.

Figure 8:
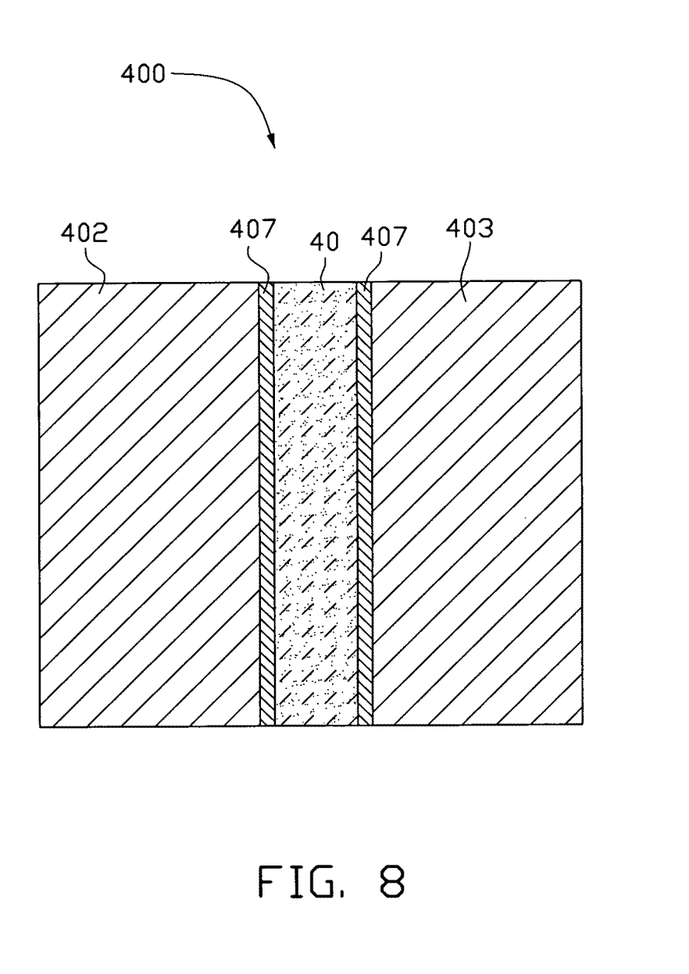
FIG. 8 displays a thermoelectric device using the thermoelectric composite materials.

Referring to FIG. 8, one embodiment of a thermoelectric device 40 comprises a first element 402, a second element 403, two electrodes 407 and a thermoelectric composite material 40. The thermoelectric composite material 40 is sandwiched between the first element 402 and the second element 403. Two electrodes 407 are separately located on the two faced surfaces of the thermoelectric composite material 40. The thermoelectric composite material 40 can be same as the thermoelectric composite material 10, 20, 30. The thermoelectric composite material 40 produces a voltage when there is a suffencent temperature difference between the first element 402 and the second element 403.

The first element 402 is one heat source with high temperature. The second element 403 is another heat source with a low temperature. Thus, a temperature difference is achieved between the two faced surfaces of the thermoelectric composite material 40. A voltage can be outputted via the two electrodes 407 separately connected with the two faced surfaces of the thermoelectric composite material 40.

One embodiment of a method of using the thermoelectric device 400 includes:
providing a thermoelectric composite material 40, the thermoelectric composite material 40 comprising:

a carbon nanotube structure comprising a plurality of carbon nanotubes and a plurality of spaces defined between the carbon nanotubes; and
an electrically conductive polymer layer coated on the carbon nanotube structure; and
achieving a sufficient temperature gradient in the thermoelectric composite material to create a voltage.

In another embodiment, the method of using the thermoelectric device 400 comprises of:
providing a thermoelectric composite material 40, the thermoelectric composite material 40 comprising:
a plurality of carbon nanotubes joined together by van der Waals attractive forces to form a carbon nanotube structure;
a plurality of spaces; and
an electrically conductive polymer layer, wherein the electrically conductive polymer layer wraps around the carbon nanotubes to form a tubular coating layer structure, and each of the plurality of carbon nanotubes and the carbon nanotube structure serve as a core and a template, respectively; and
achieving a sufficient temperature gradient in the thermoelectric composite material to create a voltage.

In yet another embodiment, the method of using the thermoelectric device 400 comprises of:
providing the thermoelectric device 400 comprising:
two electrodes 407;
a first element 402;
a second element 403; and
a thermoelectric composite material 40 sandwiched between the first element and the second element, the thermoelectric composite material 40 comprising:
a carbon nanotube structure comprising a plurality of carbon nanotubes and a plurality of spaces defined by and between the carbon nanotubes; and
an electrically conductive polymer layer coated on surfaces of the carbon nanotubes;
achieving a temperature difference between the first element 402 and the second element 403; and
outputting a voltage via two electrodes 407.

In one embodiment, the temperature difference in or between the two surfaces of the thermoelectric composite material 40 is at least 30° C.

In some embodiments, the thermoelectric composite material 40 is located between the first and the second element, 402, 403. In one embodiment, the first element 402 can have a temperature from about 47° C. to about 79° C., and the temperature of the second element 403 can be in a range from about 17° C. to about 19° C. The temperature difference between the two faced surfaces of the thermoelectric composite material can be in a range from about 30° C. to about 60° C. In another embodiment, the temperature of the first element 402 is 47° C., the temperature of the second element 403 is 17° C.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

Finally, it is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A thermoelectric device comprising:
a thermoelectric composite material comprising:
an electrically conductive polymer layer coated on a carbon nanotube structure; and
a carbon nanotube structure, wherein the thermoelectric composite material produces a voltage when there is a temperature gradient in the thermoelectric composite material,
the carbon nanotube structure comprises:
at least one drawn carbon nanotube film formed by a plurality of carbon nanotubes, wherein the plurality of carbon nanotubes having a length and an end, wherein the plurality of carbon nanotubes are successive and oriented along the length of the plurality of carbon nanotubes, and wherein the plurality of carbon nanotubes are joined end-to-end by van der Waals attractive force therebetween; and
a plurality of spaces defined by and between the plurality of carbon nanotubes.

2. The thermoelectric device of claim 1, wherein the carbon nanotube structure supports the electrically conductive polymer layer.

3. The thermoelectric device of claim 1, wherein the electrically conductive polymer layer is coated on inside surfaces of the plurality of spaces.

4. The thermoelectric device of claim 1, wherein the plurality of spaces are micropores and a size of each of the micropores is in a range from about 50 nanometers to about 500 nanometers.

5. The thermoelectric device of claim 1, wherein the carbon nanotube structure comprises at least two adjacent drawn carbon nanotube films, wherein an angle between an orientation of the plurality of carbon nanotubes in the at least two adjacent drawn carbon nanotube films is in the range from about 0 degrees to about 90 degrees.

6. The thermoelectric device of claim 1, wherein the electrically conductive polymer layer is selected from the group consisting of polyaniline, polypyrrole, polythiophene, polyacetylene, polyparaphenylene, polyphenylene vinylene, and combinations thereof.

7. The thermoelectric device of claim 6, wherein the electrically conductive polymer layer is polyaniline, and the weight percentage of the polyaniline in the thermoelectric composite material is in a range from about 5% to about 20%.

8. A thermoelectric device comprising:
a first element;
a second element; and
a thermoelectric composite material sandwiched between the first element and the second element, wherein the thermoelectric composite material produces a voltage when there is a temperature difference between the first element and the second element, the thermoelectric composite material comprising:
at least one drawn carbon nanotube film comprising:
a plurality of successive and oriented carbon nanotubes, wherein the plurality of successive and oriented nanotubes have a length and an end, wherein the plurality of successive and oriented nanotubes are joined end-to-end by van der Waals attractive force therebetween; and
a plurality of spaces defined by and between the plurality of successive and oriented carbon nanotubes; and
an electrically conductive polymer layer coated on surfaces of the plurality of successive and oriented carbon nanotubes.

9. The thermoelectric device of claim 8, wherein the temperature difference between the first element and the second element is at least 30° C.

* * * * *